United States Patent [19]

Kaufman et al.

[11] Patent Number: 5,239,266
[45] Date of Patent: Aug. 24, 1993

[54] MRI USING VARIABLE IMAGING PARAMETER(S) WITHIN A SINGLE IMAGE SEQUENCE

[75] Inventors: Leon Kaufman, San Francisco; David M. Kramer, San Rafel; John M. Coleman, Millbrae, all of Calif.

[73] Assignee: The Regents of the University of California, Oakland, Calif.

[21] Appl. No.: 986,570

[22] Filed: Dec. 7, 1992

Related U.S. Application Data

[62] Division of Ser. No. 562,869, Aug. 3, 1990, Pat. No. 5,202,632.

[51] Int. Cl.$^5$ .............................................. G01R 33/20
[52] U.S. Cl. .................................................... 324/309
[58] Field of Search ............... 324/300, 307, 309, 310, 324/311, 312, 313, 318, 322; 128/653.2, 653.5

[56] References Cited

U.S. PATENT DOCUMENTS

| | | | |
|---|---|---|---|
| 4,641,095 | 2/1987 | Riederer | 324/307 |
| 4,678,996 | 7/1987 | Haacke et al. | 324/309 |
| 4,698,593 | 10/1987 | Crooks | 324/309 |
| 4,728,893 | 3/1988 | Feinberg | 324/312 |
| 4,734,646 | 3/1988 | Shenoy et al. | 324/309 |
| 4,837,513 | 6/1989 | Yao | 324/309 |
| 4,908,573 | 3/1990 | Kaufman et al. | 324/309 |
| 4,970,457 | 11/1990 | Kaufman et al. | 324/309 |
| 4,986,272 | 1/1991 | Riederer et al. | 324/309 |
| 5,157,330 | 10/1992 | Kaufman et al. | 324/320 |
| 5,184,074 | 2/1993 | Arakawa et al. | 324/309 |

OTHER PUBLICATIONS

"Two-Dimensional Spectroscopy. Application to Nuclear Magnetic Resonance" by Aue et al. The Journal of Chemical Physics, vol. 64, No. 5, Mar. 1, 1976 pp. 2229-2246.

"Reduction of MR Imaging Time by the Hybrid Fast-Scan Technique[1]" by E. Mark Haacke, PhD et al—Radiology 1986; pp. 158-529.

"Characteristics of Partial Flip Angle and Gradient Reversal MR Imaging[1]" by Mark L. Winkler, MD et al—Radiology 1988, pp. 166; 17-26.

"Intra-Acquisition Modification of Pulse Sequence Parameters" by Farzaneh et al—SMRM Aug. 1989, p. 855.

Primary Examiner—Michael J. Tokar
Attorney, Agent, or Firm—Nixon & Vanderhye

[57] ABSTRACT

At least one imaging parameter (e.g., the repetition interval TR or the initial nutation angle $\theta$) is varied during the course of a single MR image sequence. This variation in at least one imaging parameter is preferably controlled so as to increase the contrast and signal-to-noise ratio of lower spatial frequency image components. For example, by using longer TR intervals (or smaller initial nutation angle $\theta$) during lower spatial frequency phase encoding sub-sequences, relatively more signal is gathered from NMR nuclei having long T1 parameters thus providing a resultant image with many characteristics of a much longer overall sequence (e.g., one using uniform relatively long TR intervals for all spatial frequency phase encoding sub-sequences).

4 Claims, 6 Drawing Sheets gx = READOUT GRADIENT
gy = Y AXIS PHASE ENCODING
gz = SLICE SELECTION (ALSO PHASE ENCODED IF 3DFT MRI IS USED)

SE₁ IMAGE WITH FIXED TR=1.0 SECONDS
(TOTAL IMAGING TIME = T)

SE₁ IMAGE WITH VARIABLE
TR=1.0 TO 2.7 SECONDS
(TOTAL IMAGING TIME = 1.4 T
INSTEAD OF USUAL 2.7T)

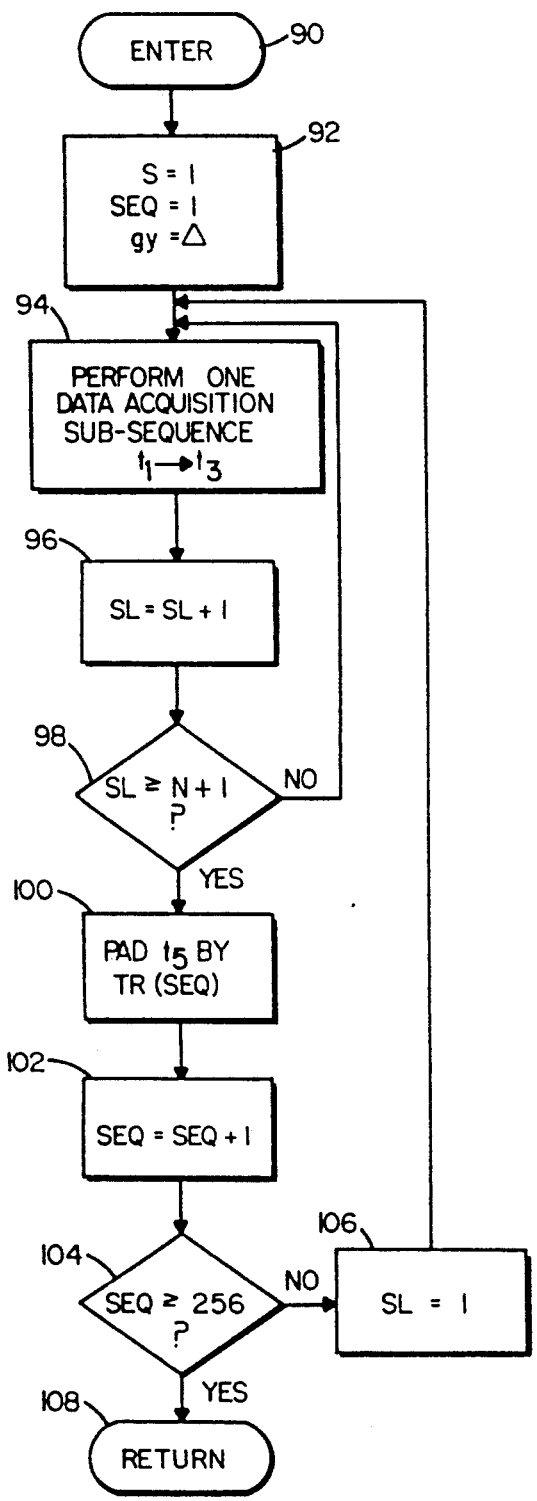
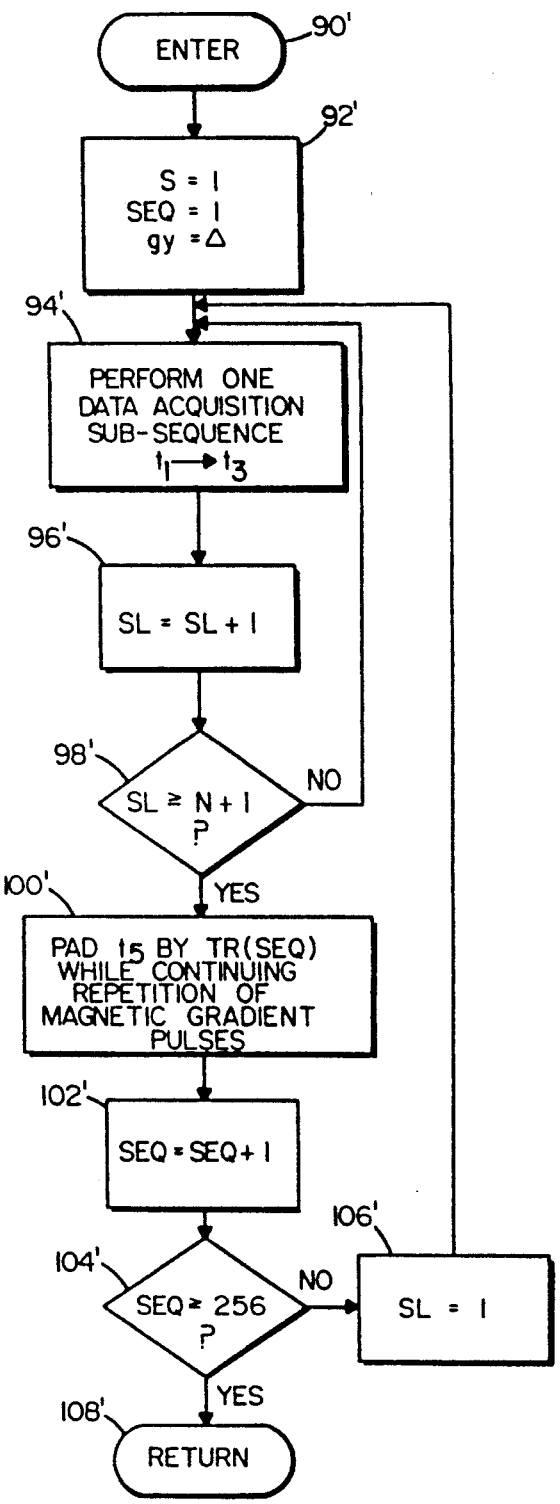
FIG. 7B
FIG. 7C

MRI USING VARIABLE IMAGING PARAMETER(S) WITHIN A SINGLE IMAGE SEQUENCE this is a division of application Ser. No. 07/562,869, filed Aug. 3, 1990, now U.S. Pat. No. 5,202,632.

SPECIFICATION

This invention generally relates to magnetic resonance imaging (MRI) utilizing nuclear magnetic resonance (NMR) phenomena. It is more particularly directed to method and apparatus for achieving a high quality image in a relatively shorter required data acquisition time.

MRI is by now a well-known and commercially available practice. In general, nuclei having a net magnetic moment tend to align with a superimposed strong, substantially homogeneous, magnetic field. Such quiescently aligned nuclei are then selectively perturbed in various manners (with the proper NMR RF frequency electromagnetic fields in conjunction with suitably pulsed magnetic gradient fields) to produce spatially encoded NMR RF responses that can be measured and mapped to provide a visual representation of NMR nuclei distributions. Typically, hydrogen nuclei are utilized for MRI in human patients.

Although there are known techniques for very rapidly acquiring sufficient MRI data to construct a relatively poor quality image, data acquisition for higher quality images typically requires a protracted procedure. During this procedure the patient is expected to lie substantially motionless inside what can be a rather massive and relatively closed apparatus. As might be expected, there is a limit to the patients' endurance of these conditions —especially where the patient may also be suffering various forms of medical duress during the imaging procedure. Accordingly, it is sometimes impractical or impossible to perform a desired imaging sequence simply because it requires too much time.

For example, one common MR imaging sequence utilizes hundreds of subsequences (e.g., 256 per slice volume). In each subsequence, a slice volume is selectively addressed by an initial NMR RF nutation pulse (e.g., 90°). This is followed by a spatial frequency phase encoding pulse of magnetic gradient field (e.g., typically $g_y$) and one or more 180° RF nutation pulse(s) so as to produce one or more NMR spin echo RF response(s) (which are then typically sampled, digitized, stored and/or FFT processed to produce image pixel values). Magnetic gradient reversals may also be utilized (instead of 180° RF nutation pulses) to recall similar RF spin echo responses. The elapsed time between subsequences having different spatial frequency phase encoding is typically referred to as the repetition interval TR. The delay must be on the order of T1 to allow recovery of alignment.

If one to wishes to image tissues having nuclei with relatively long T1 NMR parameters, then the repetition interval TR must typically also be made relatively long so as to acquire the necessary image data. Using conventional spin echo data acquisition sequences (e.g., of the type just briefly described), it may be desirable to perform a total image sequence in excess of 20 minutes (which is probably the maximum time that even a healthy person can be expected to endure for a single image sequence). Accordingly, as a practical matter, there are some kinds of MR image data that, as a practical matter, cannot be acquired using conventional sequences.

NMR phenomena are also utilized in chemical spectroscopy dating back to the earlier part of this century. There have been prior suggestions of varying NMR sequences in that context. These variations were always continuous and generally in linear time increments to facilitate analysis by a second FFT. Fourier NMR Zeugmatography was an early example:

"Two-dimensional spectroscopy. Application to nuclear magnetic resonance" by Messrs. Aue et al, *Journal or Chemical Physics*, Vol. 64, No, 5, 1 March 1976, pp. 2229-2246.

We are also presently aware of a prior MRI system which utilized various image parameters within a single image sequence. However, so far as is known to the inventors, such MRI system was proposed to use only a multiple TE parameter during a signal image sequence. Furthermore, such multiple TE parameter was apparently used *only* to provide different spatial frequency encodings thus shortening imaging time in this manner. See, for example:

"Reduction of MR Imaging Time by the Hybrid Fast-Scan Technique" by Messrs Haacke et al, *Radiology*, Vol. 158, No. 2, Feb. 1986,, pp. 521-529.

The method of Haacke et al actually does not vary TE during acquisition. Rather, the acquisition is fixed at two or more values of TE as for multi echo imaging, except that each TE is acquired with a different phase encoding step. Typically, long TE values are used to span high spatial frequencies, and short TE values span low spatial frequency sequences. This maximizes S/N per unit time.

We have now come to appreciate that a typical user of MRI is interested more in relatively large groups of pixels (e.g. "blobs") than in single individual pixels within an image. That is, the human eye is looking for shapes, edges, etc. rather than the exact value of a single individual pixel.

Based in part upon this realization, we have now conducted experiments by which we have discovered that one may achieve relatively shorter overall image data acquisition times without apparent loss of resolution. This may be achieved, for example, by effectively weighting the data acquisition so as to favor lower spatial frequency phase encoded portions of the overall data acquisition sequence. By thus purposefully changing image parameters during a single image sequence of data acquisition, the individual pixel values may actually be "wrong" if rigorously analyzed with precise mathematics. Nevertheless, because the final medical value of the image is more related to shapes, edges, etc. of groups of pixels, the result may be superior in some respects.

We have discovered that for many imaging purposes, the most important data insofar as image contrast is concerned involves a relatively small subset of relatively low spatial frequency phase encoded subsequences. By devoting relatively greater resources (e.g., data acquisition time) to this portion of the overall sequence, one may obtain images that would otherwise be impossible. In particular, an image which is substantially the same in many respects as one that can be obtained in a 30 minute image sequence might be obtained with only 12 minutes of data acquisition (e.g., because greatly reduced data acquisition time is allocated to most of the higher spatial frequency phase encoded sub-sequences).

One particular human tissue having a relatively long T1 NMR parameter is cerebral spinal fluid (CSF) having a T1 parameter on the order of four seconds. Thus, to get good contrast images of CSF, very long TR intervals are required. However, using this invention, such relatively long TR intervals need be used only for a relatively few of the lowest spatial frequency phase encoded sub-sequences. In theory, tissues having such relatively longer T1 parameters imaged in this way should have less well-defined edges. However, such is not typically visually apparent in many circumstances—and may be so slight as to be relatively unimportant to medical interpretation.

One possible reason for our observations is that tissues having relatively long T1 are typically surrounded by tissues having relatively short T1. Thus the surrounding tissues will still be represented by relatively good contrast and signal-to-noise ratios even at high spatial frequencies where shorter TR intervals are utilized. In effect, a relatively sharply defined image of short T1 tissues is superimposed onto a less well defined image of long T1 tissues—and the short T1 tissue borders help better define the edges of the long T1 tissues.

Although one may achieve special imaging effects by programmed changes in other image parameters during a single image sequence (e.g., by varying the initial nutation flip-angle, the time to echo TE parameter, etc.), our presently preferred exemplary embodiment varies the repetition interval TR image parameter so as to selectively enhance lower spatial frequency image components of the acquired image data. In particular, more signal is obtained from nuclei having relatively longer T1 NMR parameters thus producing a relatively higher quality image of tissues having such longer time constant nuclei.

Although somewhat different physics are involved, similar final image results may be achieved by varying the initial nutation angle $\theta$ during a single image sequence (i.e., as opposed to or in addition to variation of the TR imaging parameter during a single image sequence). Here, a smaller initial nutation angle $\theta$ is comparable in final effect to a longer TR. Thus, to enhance contrast and signal to noise of longer T1 tissues for low spatial frequency encoded sub-sequences, one may reduce the initial nutation angle $\theta$ for these lower spatial frequencies.

For example, variable TR emphasizes the long T1 of CSF by using a long TR for the low frequency phase encodings. If this emphasis is desired it can also be obtained from lowering the excitation flip angle from 90°. As this angle is lowered signal increases, reaches a peak (Ernst angle) and decreases to zero at zero degrees. The long T1, the smaller the angle at which the peak occurs, and the larger the percent increase of signal at peak as compared to signal at 90°. Therefore, small flip angles are qualitatively similar to long TR values. Thus, decreasing flip angle for the low frequency phase encodings will have a similar impact on contrast as extending TR. Small flip angles used to highlight CSF have lower S/N than operation near Ernst angles for the remainder of soft tissues with shorter T1, so it is desirable to obtain high frequency phase encodings (which have weaker signals if all else is equal) with relatively large flip angles to maximize S/N, and the low frequency phase encodings (which have bigger signals) with small angles to establish the desired contrast.

In implementing variable TR imaging, we have found that the distortions caused by changing eddy currents may also play an important part in the total image quality. However, we have discovered that one may maintain relatively "steady state" eddy currents by continuing to use the usual sequence of pulsed magnetic gradient fields during lengthened TR intervals (but without the usual RF nutation pulses).

These as well as other objects and advantages of this invention will be more completely understood and appreciated by careful study of the following detailed description of presently preferred exemplary embodiments taken in conjunction with the accompanying of which:

Figure 2A:
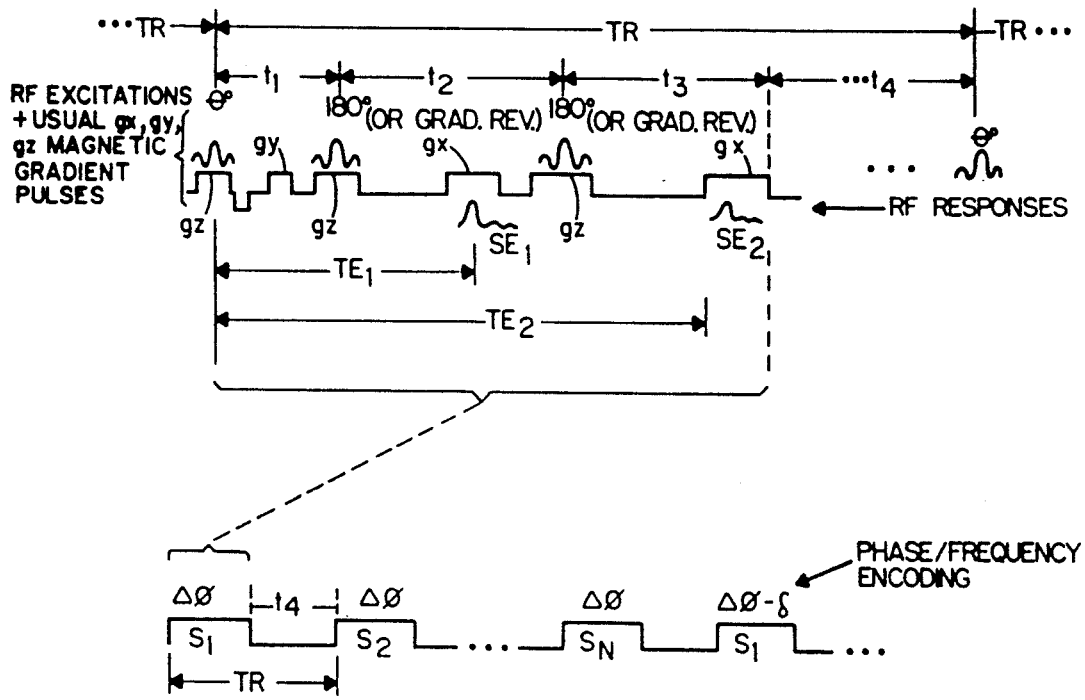
FIGS. 2A, 2B and 2C are schematic representations of MR imaging sequences representing exemplary embodiments of this invention for use in the system of FIG. 1.
Figure 2B:
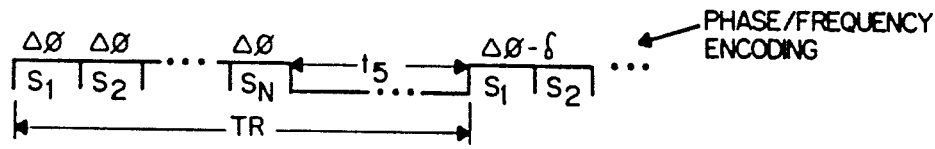
Figure 2C:
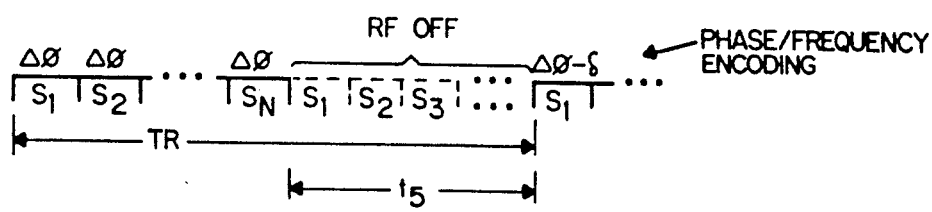
Figure 5:
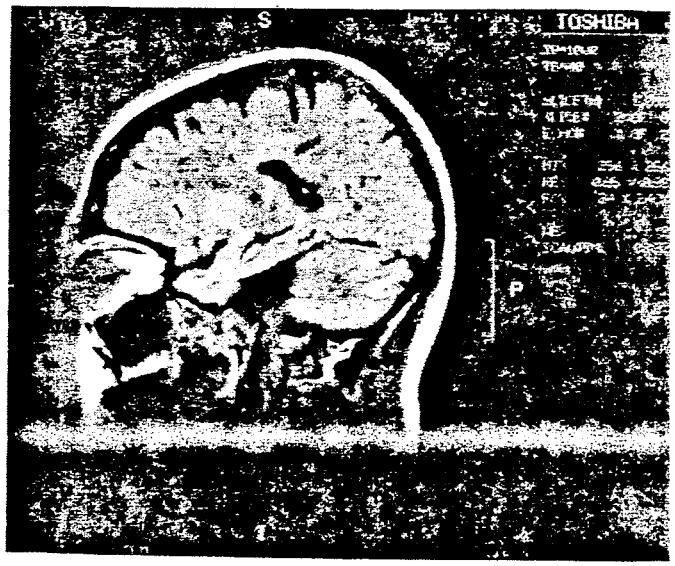
FIG. 5 is a photograph of an MR image using conventional spin echo data acquisition with a fixed TR of 1.0 second.
Figure 6:
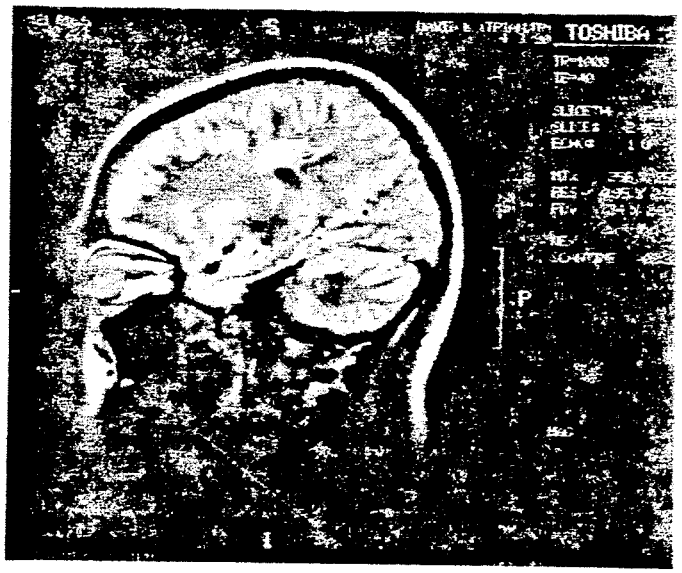
Figure 7A:
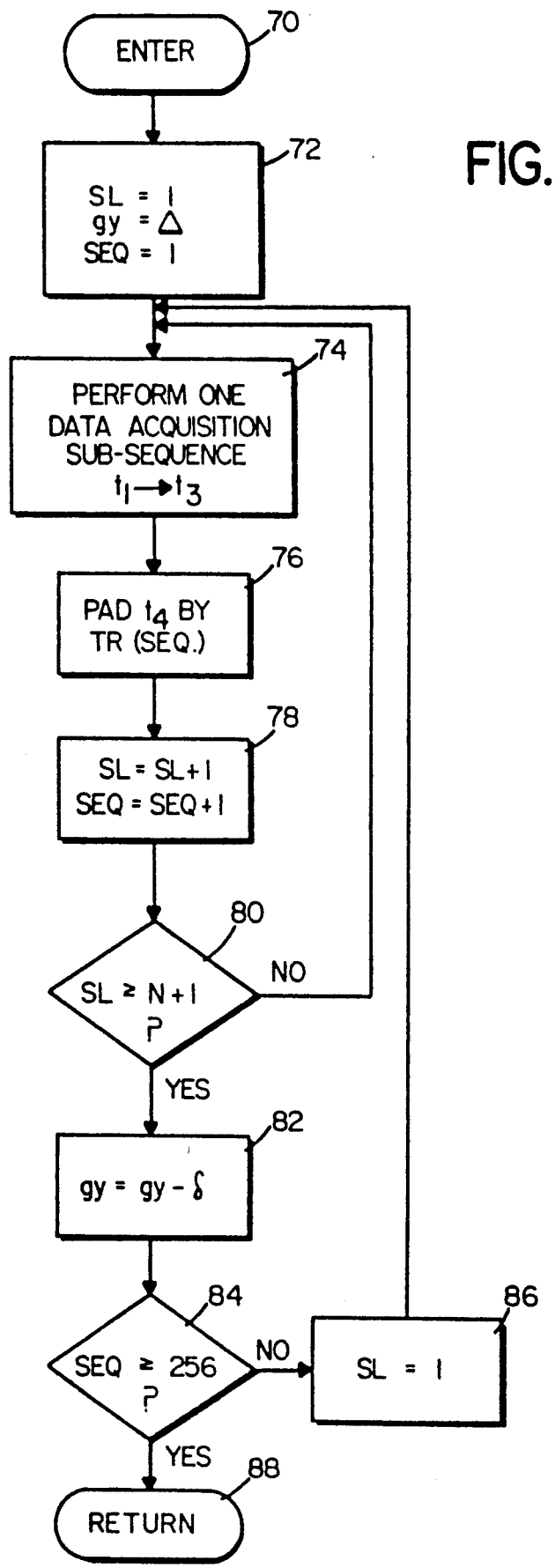

FIG. 6 is a photograph similar to that of FIG. 5 but using a variable TR of 1 to 2.7 seconds thus producing an image characteristic of a data acquisition interval 270% longer than that of FIG. 5 (but actually using a total data acquisition time of only 140% of that used for the image of FIG. 5); and FIGS. 7A, 7B and 7C depict simplified flow charts for controller programming designed to implement the embodiments of FIGS. 2A, 2B and 2C, respectively.

Figure 1:
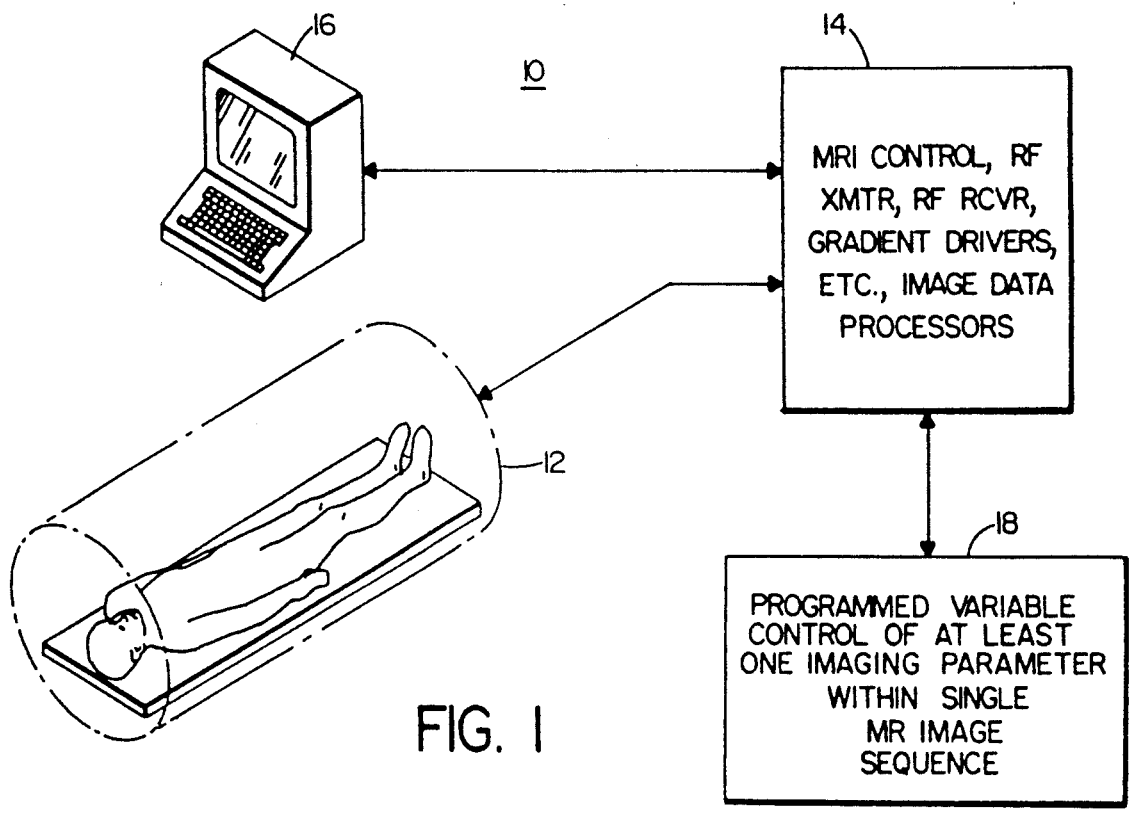
FIG. 1 is a general block diagram of an MRI system modified so as to utilize this invention.

The MRI system 10 depicted in FIG. 1 includes the usual gantry structure 12 (including a high strength magnetic field generator, RF and magnetic gradient coil structures, patient transport mechanisms, etc.). The gantry structure 12 is interfaced with suitable MRI system control devices 14 which are capable of sequentially controlling the magnetic field and gradient coil generators, RF transmitters, RF receivers, etc. The controls 14 include suitable analog-to-digital converters for capturing NMR RF responses as image data during successive data acquisition intervals, etc. (as will be appreciated by those in the art).

Typically, the control apparatus 14 includes at least one programmed computer for managing time related MRI processes in an efficient manner under control of an operator via the usual keyboard/display terminal 16. As depicted at 18 in FIG. 1, the exemplary embodiment of this invention includes suitable programs (e.g., in magnetic or silicon media) to control variations of one or more imaging parameters within a single MR image sequence.

A single TR interval (out of, for example, 256 per slice volume in a typical complete MR image sequence) is depicted at FIG. 2A. Such an interval is also sometimes here referred to as a "subsequence" of the overall image sequence.

In the example shown at FIG. 2A, a TR interval includes four sub-intervals $t_1$, $t_2$, $t_3$, and $t_4$. At the beginning of the exemplary TR interval, an initial RF nutation pulse of $\theta°$ (e.g., 90°) is applied in the presence of a $g_z$ magnetic gradient pulse so as to selectively address a given slice volume of NMR nuclei. During the ensuing $t_1$ interval, a phase encoding pulse $g_y$ of magnetic gradient is imposed (e.g., having a magnitude/duration representative of a particular spatial frequency phase encoding). The signal is subsequently recalled in the same slice (e.g., via a slice selective 180° RF nutation pulse or a gradient reversal) so as to produce a first spin echo $SE_1$ during the $t_2$ interval. During this first spin echo, a gradient pulse $g_x$ is imposed for the readout data acquisition interval (during which the RF spin echo is rapidly sampled, digitized and stored for subsequent MR image processing, e.g. using 2DFT as will be appreciated by those in the art). If desired, the signal is subsequently recalled yet again (e.g., by another 180° RF pulse or gradient reversal) so as to produce in interval $t_3$ yet another spin echo $SE_2$ (which can also be acquired as data for MR image processing purposes).

The remainder of the TR interval in FIG. 2A is "padded" during interval $t_4$ so as to produce the desired TR parameter value. As depicted in the schematic representation at the lower portion of FIG. 2A, the TR intervals for a given $\Delta\phi$ phase encoding may be repeated N times during a "multi-slice" image sequence.

Alternatively, as depicted in FIG. 2B, the TR interval may be considered to comprise the entirety of N multi-slice sub-sequences which are "padded" by time interval $t_5$ (the interval $t_4$ within each slice sequence now possibly being zero). Where the TR interval is padded as shown in FIG. 2B, then the usual "steady state" eddy currents may be sufficiently disrupted to cause image artifact. To avoid this variation in eddy currents (which can cause distortion artifact in the images), the $t_5$ interval can be "padded" as schematically depicted in FIG. 2C by cyclically repeating all of the usual magnetic gradient pulse sub-sequences during $t_5$ for all of the successive slices, S1 ... in the usual multi-slice procedure—but without any use of RF nutation pulses.

Figure 3:
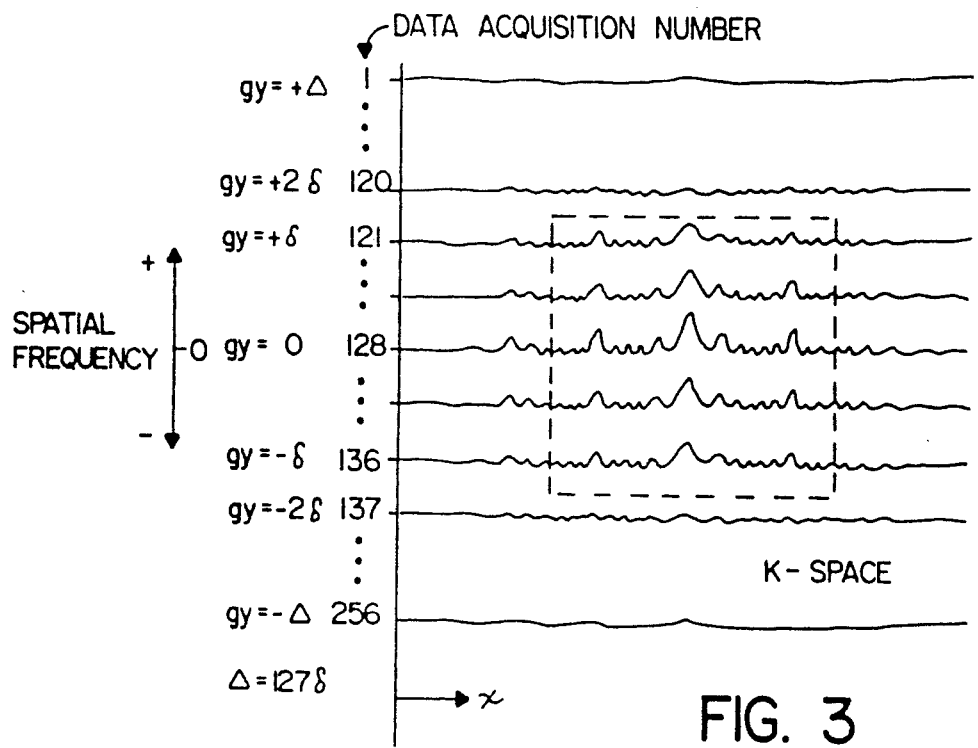
FIG. 3 is a schematic depiction of partially processed image data depicting the central portion of k-space in which greater signal acquisition resources are to be allocated in an exemplary embodiment of this invention.

A k-space plot of partially processed image data for one slide volume is depicted at FIG. 3 showing a separate data line for each of 256 data acquisition sub-sequences. In this particular example, maximum spatial frequency phase encoding of $+\Delta$ occurs during data acquisition sub-interval 1. Each successive data acquisition sub-interval decreases the phase encoding by an increment of $\delta$ until the 128th data acquisition sub-interval at which there is zero spatial frequency phase encoding. Thereafter, the phase encoding incrementally increases in a negative direction for the remainder of the 256 data acquisitions. In our presently preferred exemplary embodiment, we prefer to allocate greater acquisition resources to the central portion of k-space as depicted by dotted liens in FIG. 3. In particular, in this example, the center 16 data acquisitions (data acquisition numbers 121–136) are acquired using longer TR intervals so as to enhance the contrast and signal-to-noise data associated with lower spatial frequencies in the final image. As noted earlier, similar final images might be obtained by reducing the initial nutation angle $\theta$ during these center data acquisitions.

Figure 4:
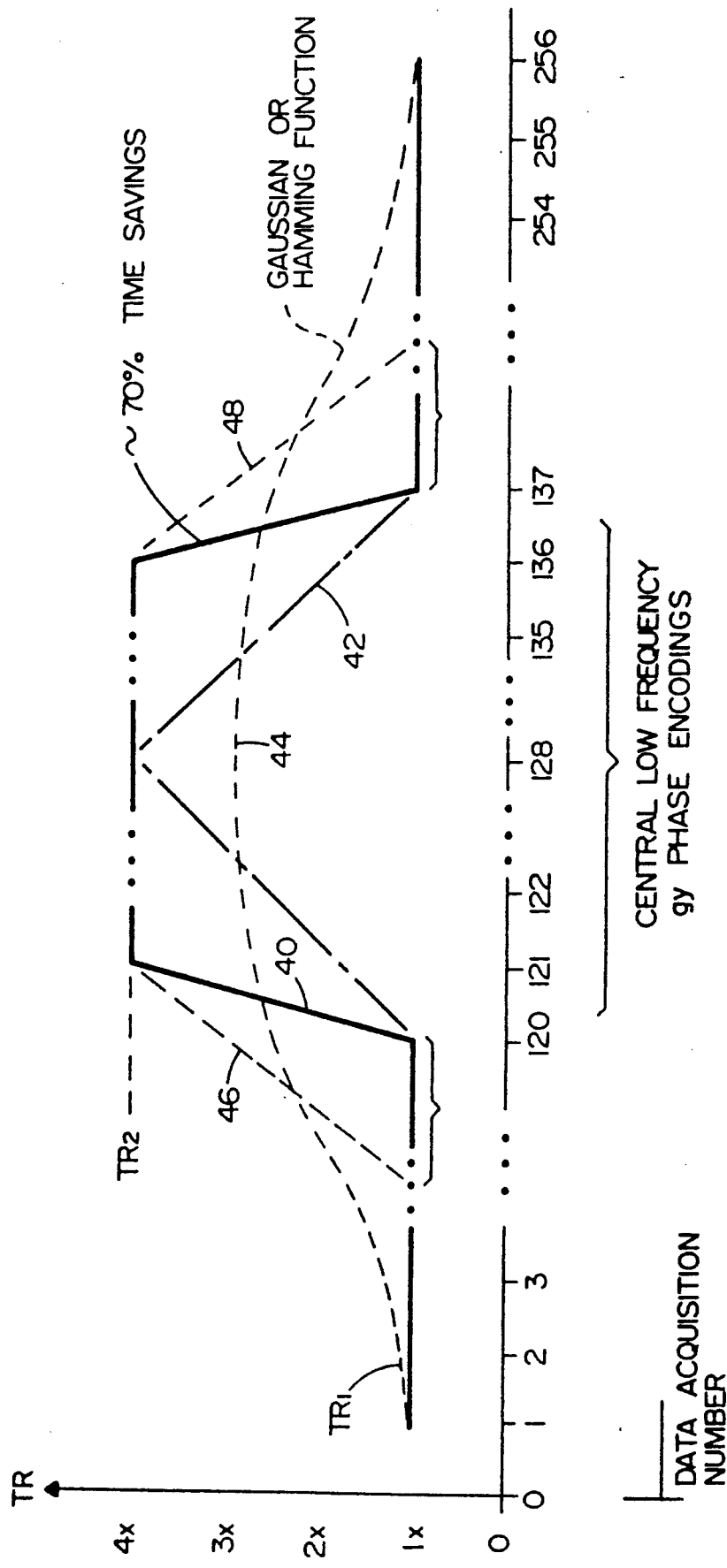
FIG. 4 is a graphical depiction illustrating variations of the TR parameter during a single imaging sequence in accordance with this invention.

Several possible "waveform" variations of the TR image parameter over a single image sequence (of, e.g., 256 sub-sequences) are depicted at FIG. 4. (As will be appreciated, the variation in $\theta$, if used, for similar image results would be an inverse of the waveforms shown in FIG. 4). At first blush, one might be tempted to use a "square" wave pattern of TR variation as depicted at 40 in FIG. 4. By utilizing a 4-to-1 ratio of TR intervals as depicted, one can achieve a 70% time savings and have final images that are in many respects characteristic of the longest 4x TR intervals $TR_2$ (even though the largest majority of data acquisition sub-intervals only use a 1x TR parameter $TR_1$).

Another possibility is a "triangular" wave as depicted at 42. Still other possibilities are a smoother Gaussian or Hamming function type of waveform as depicted at 44 or a modified square wave form (e.g. with ramp transitions as depicted at 46, 48 in FIG. 4). For reasons explained in more detailed below, at least some of the lowest phase encoded data acquisition sub-intervals should preferably have relatively constant TR parameter values (thus, the waveforms 44 or 46, 48 are presently preferred).

A number of the TR "waveforms" depicted in FIG. 4 have been tested using a baby oil bottle plus a bottle of saline solution as phantoms. As the width of the square TR pattern 40 was increased, a ringing artifact with increasing frequency was noted. Upon reflection, such ringing artifact might be expected based on the Fourier transform of a square waveform. In any event, because ringing artifacts are not desirable in the final image, such sharp transition in TR values is not presently preferred (albeit it may provide an acceptable image result under some circumstances).

Ringing at the interface of brusque TR or $\theta$ changes, could be ameliorated by the use of a k-space filter in the phase encoded direction which rolls off signal values near the interface (so as to diminish the value of the sudden step in signal strength). Such a filter may span 10 lines in k-space on each side of the interface out of a 256-line acquisition. For example, 10 lines from the step, the filter would be unity, and would decrease linearly from one side, and increase linearly from the other side of the interface. Thus at the interface one side may reach 1.1 and the other 0.9, in such a way that the larger (smaller) value of the filter would apply to the k lines with smaller (larger) signal, e.g., long (short) TR, or small (big) flip angle. In this case there would be a 20% equalization factor. Because the T1 of CSF is well known and fixed at all field strengths, this equalization factor can be calculated for TR or flip angle pairs.

Since Gaussian or Hamming function waveforms 44 have a Fourier transform with fairly weak sidelobes (which may be considered to be convoluted with the image) this form of TR waveform was also tested on phantoms (and on a volunteer patient). It should be noted that since the effects of TR variations on signal strengths are not linear, the pattern of signal strengths can be expected to be a distorted version of the TR waveform pattern (in seconds).

Using such Gaussian or Hamming function waveforms, phantom tests revealed almost no ringing artifacts. The head scan of a volunteer patient also looked good but had some very weak high frequency ripple. This particular test used a double spin echo sequence (TE values of 40 and 80 milliseconds, respectively) with TR parameters changing between 2.8 and 1.0 seconds (as depicted by waveform 44 of FIG. 4). Since a fairly wide Hamming function pattern was used for this test, the scan time was only about one-third less than that of an equivalent 2.8 seconds TR scan (during a 9 slice multi-slice acquisition sequence).

Based on the Fourier transform of the triangular waveform 42, one might expect its performance to be some sort of compromise between the square waveform 40 and the Hamming function waveform 44, However, as noted above, the actual shape of the pattern in units of signal strength will be a distorted version of the TR pattern (in seconds). Because of this distortion, the use of a triangular pattern 42 could conceivably give results as good as the Hamming function 44 (after its expected distortion).

The photographs depicted in FIGS. 5 and 6 represent a standard fixed TR interval image and a variable TR image, respectively. A nine slice multi-slice scan was performed using a two dimensional FT mode which produces two spin echoes at each of nine slices. The standard TR scan FIG. 5) used an overall repetition time of 1.0 second. The variable TR image sequence (FIG. 6) used a TR parameter that remained at 1.0 second for the outermost 64 spatial frequency phase encodings and which increased linearly to about 2.7 seconds at the center cycle (e.g., 0 spatial frequency/phase encoding) before decreasing over the next 64 phase encodings to 1.0 second where it remained constant for the last 64 phase encodings. Thus, the variable scan required about 40% more time. However, the image which resulted as (FIG. 6) bears the contrast and signal-to-noise ratio of an image sequence requiring about 270% more data acquisition time.

As can be seen by comparing FIGS. 5 and 6, there is a marked improvement (in FIG. 6) in tissue contrast and signal strength. Thus, one can achieve faster overall scan times for a given image characteristic using this invention. In fact, it is possible to effectively perform scan sequences using this invention which are prohibitively long if accomplished in the standard way using fixed TR intervals. Thus, the applications of MRI may be enhanced and increased beyond that which is conceivably possible using earlier techniques.

We have also used this invention for three dimension FT scans. Here, the relative time advantage is even greater because there are two phase-encoded dimensions (y and z) over which the TR interval may be varied. For example, relatively longer TR intervals are only used in the central lower spatial frequency scan times (e.g., when only very small phase encoded magnetic gradient pulses are used for encoding in both the y and z axis dimensions).

We have successfully imaged phantoms having a contrast that resembles scans that otherwise would have required 10 to 20 times the actual scan time utilized for these experiments.

In using this invention, the edges of depicted objects (e.g,. the higher spatial frequency components) will only have contrast that is characteristic of the shorter TR intervals. Thus, the variable TR image of FIG. 6 may be a bit "fuzzier" when comparing the finest structural details. Nevertheless, the larger lower spatial frequency depictions of typically greatest medical interest are enhanced as evident even from the photographs of FIGS. 5 and 6 (which due to various printing and reproduction processes are of diminished quality in the printed patent drawings).

We also presently consider it advantageous to have a finite region of fixed TR parameter in a range of the lowest frequency phase encoded data acquisition subsequences. This is because various practical imperfections typically lead to the strongest raw data signals being displaced a small amount from the expected location at zero phase encoding gradient strength. If the TR parameter is changed during these very important (i.e., large magnitude) signals, a significant image distortion could result (as well as lost efficiency).

One possible control computer program segment for implementing the variable TR sequence of FIG. 2A is depicted in simplified flow diagram form at FIG. 7A. Here it is assumed that a table of indexed TR values is stored to represent a desired functional relationship or "waveform" as depicted in FIG. 4.

Upon entry at 70, a slice counter SL, a sub-sequence counter SEQ and the phase-encoding parameter $g_y$ are all initialized at 72. Then a conventional data acquisition sub-sequence is performed during $t_1$ to $t_3$ at 74. Time interval $t_4$ is padded to the amount indicated by the appropriately indexed TR value at 76. Counters SL and SEQ are incremented at 78, and counter SL is tested for maximum value at 80. The inner loop is control passes to B2 where $g_y$ is decremented and the SEQ counter is tested for maximum value at 84. If not yet at the maximum, the counter SL is reset to initial value at 86 and the outer loop is repeated. Finally, a program return is encountered at 88.

The sequence of FIG. 2B can be implemented by a program segment such as shown in FIG. 7B. Here, upon entry at 90, initialization is also performed at 92 before a sub-sequence $t_1$ to $t_3$ interval is performed at 94. The slice counter is incremented at 96 and tested at 98 for the inner loop back to immediately repeat the sub-sequence for the next slice. After all N slices are thus processed, the $t_5$ padding is provided at 100 by the appropriate TR value (as indexed by the SEQ counter which is incremented at 102 and tested at 104 for outer loop back via the slice counter reset at 106). Eventually program return is encountered at 108.

The sequence of FIG. 2C can be implemented by a program segment as shown in FIG. 7C (which is similar to that of FIG. 7B and thus uses the same reference numbers with primes—except at 100' where continued repetition of magnetic gradient pulses is effected during $t_5$ padding).

While only a few exemplary embodiments of this invention have been described in detail, those skilled in the art will appreciate that many variations and modifications may be made in these exemplary embodiments while yet retaining many of the novel features and advantages of this invention. Accordingly, all such variations and modifications are intended to be included within the scope of the appended claims.

What is claimed is:

1. A method for acquiring MR image data within a predetermined limited data acquisition time with T1 image contrast and signal-to-noise ratio for lower spatial frequencies of said image data being characteristic of a data acquisition time longer than said predetermined limited data acquisition time, said method comprising:

during MR image data acquisition for lower spatial frequencies, changing at least one MR imaging parameter to produce greater RF signal responses form nuclei having longer T1 NMR parameters as compared to MR image data acquisition for higher spatial frequencies;

wherein NMR repetition time TR is made longer for a subset of lower spatial frequencies;

wherein a phase-encoded multi-slice MR imaging sequence is utilized for data acquisition and the time between repeated data acquisitions for a group of slices is changed to control, at least in part, the duration of the TR interval, and wherein a sequence of magnetic gradient and RF pulses is used to elicit MR image data from individual slices and wherein during said time between repeated data acquisitions for a group of slices a magnetic gradient pulse sequence continues to occur thus maintaining substantially steady state eddy current effects even though the TR interval is changed.

2. Apparatus for acquiring MR image data within a predetermined limited data acquisition time with T1 image contrast and signal-to-noise ratio for lower spatial frequencies of said image data being characteristic of a data acquisition time longer than said predetermined limited data acquisition time, said apparatus comprising:

means for changing at least one MR imaging parameter during MR image data acquisition for lower spatial frequencies, to produce greater NMR RF signal response from nuclei having longer T1 NMR parameters as compared to MR image data acquisition for higher spatial frequencies;

means for processing said signal responses to produce a visual MR image;

wherein said means for changing causes said NMR repetition time TR to be longer for a subset of lower spatial frequencies;

wherein a phase-encoded multi-slice MR imaging sequence is utilized for data acquisition and said means for changing causes the time between repeated data acquisitions for a group of slices to be changed to control, at least in part, the duration of the TR interval, and wherein a sequence of magnetic gradient and RF pulses is used to elicit MR image data from individual slices and wherein during said time between repeated data acquisitions for a group of slices said means for changing causes a magnetic gradient pulse sequence to continue to occur thus maintaining substantially steady state eddy current effects even though the TR interval is changed.

3. A method for acquiring MR image data within a predetermined limited data acquisition time with T2 image contrast and signal-to-noise ratio for lower spatial frequencies of said image data being characteristic of a data acquisition time longer than said predetermined limited data acquisition time, said method comprising:

during MR image data acquisition for lower spatial frequencies, changing at least one MR imaging parameter to produce greater NMR RF signal responses from nuclei having longer T1 NMR parameters as compared to MR image data acquisition for higher spatial frequencies;

wherein NMR repetition time TR is made longer for a subset of lower spatial frequencies;

wherein a phase-encoded multi-slice MR imaging sequence is utilized for data acquisition and the time between repeated data acquisitions for a group of slices is changed to control, at least in part, the duration of the TR interval, and wherein a sequence of magnetic gradient and RF pulses is used to elicit MR image data form individual slices and wherein during said time between repeated data acquisitions for a group of slices a magnetic gradient pulse sequence continues to occur thus maintaining substantially steady state eddy current effects even though the TR interval is changed.

4. Apparatus for acquiring MR image data within a predetermined limited data acquisition time with T2 image contrast and signal-to-noise ratio for lower spatial frequencies of said image data being characteristic of a data acquisition time longer than said predetermined limited data acquisition time, said apparatus comprising:

means for changing at least one MR imaging parameter during MR image data acquisition for lower spatial frequencies, to produce greater NMR RF signal response from nuclei having longer T1 NMR parameters as compared to MR image data acquisition for higher spatial frequencies;

means for processing said signal responses to produce a visual MR image;

wherein said means for changing causes said NMR repetition time Tr to be longer for a subset of lower spatial frequencies;

wherein a phase-encoded multi-slice MR imaging sequence is utilized for data acquisition and said means for changing causes the time between repeated data acquisitions for a group of slices to be changed to control, at least in part, the duration of the TR interval, and wherein a sequence of magnetic gradient and RF pulses is used to elicit MR image data from individual slices and wherein during said time between repeated data acquisitions for a group of slices said means for changing causes a magnetic gradient pulse sequence to continue to occur thus maintaining substantially steady state eddy current effects even though the Tr interval is changed.

* * * * *